(12) United States Patent
Woo et al.

(10) Patent No.: US 9,564,294 B2
(45) Date of Patent: Feb. 7, 2017

(54) PLASMA TREATMENT APPARATUS AND PLASMA ANTENNA

(75) Inventors: Sang Ho Woo, Gyeonggi-do (KR); Il Kwang Yang, Gyeonggi-do (KR); Byung Gyu Song, Seoul (KR)

(73) Assignee: EUGENE TECHNOLOGY CO., LTD., Yongin-si, Gyeonggi-do (KR)

(*) Notice: Subject to any disclaimer, the term of this patent is extended or adjusted under 35 U.S.C. 154(b) by 977 days.

(21) Appl. No.: 13/126,042

(22) PCT Filed: Oct. 26, 2009

(86) PCT No.: PCT/KR2009/006178
§ 371 (c)(1),
(2), (4) Date: Apr. 26, 2011

(87) PCT Pub. No.: WO2010/062040
PCT Pub. Date: Jun. 3, 2010

(65) Prior Publication Data
US 2011/0198032 A1 Aug. 18, 2011

(30) Foreign Application Priority Data
Nov. 3, 2008 (KR) .................. 10-2008-0108283

(51) Int. Cl.
*H01J 37/32* (2006.01)
*H05H 1/46* (2006.01)

(52) U.S. Cl.
CPC .......... *H01J 37/3211* (2013.01); *H01J 37/321* (2013.01); *H05H 1/46* (2013.01)

(58) Field of Classification Search
CPC .............. C23C 16/505; C23C 16/507; H01J 37/32082; H01J 37/321; H01J 37/3211; H01J 37/32137; H01J 37/32165; H05H 1/46
(Continued)

(56) References Cited

U.S. PATENT DOCUMENTS

| | | | |
|---|---|---|---|
| 5,897,713 A * | 4/1999 | Tomioka et al. | 118/723 I |
| 6,475,334 B1 * | 11/2002 | Harano | 156/345.48 |
| 2005/0109462 A1 * | 5/2005 | Lee et al. | 156/345.48 |

FOREIGN PATENT DOCUMENTS

| | | |
|---|---|---|
| JP | 09-245993 | 9/1997 |
| KR | 10-0238627 | 1/2000 |

(Continued)

OTHER PUBLICATIONS

International Search Report mailed Jun. 4, 2010, for PCT/KR2009/006178.
(Continued)

*Primary Examiner* — Karla Moore
*Assistant Examiner* — Benjamin Kendall
(74) *Attorney, Agent, or Firm* — Rabin & Berdo, P.C.

(57) ABSTRACT

According to one embodiment of the present invention, a plasma treatment apparatus comprises: a chamber having an inner space in which processes for an object to be treated are performed; and an antenna which is arranged to cover the side part of the chamber, and which forms electric fields in said inner space to generate plasma from the source gas supplied in the inner space. The antenna includes a helical antenna which is formed into a helical shape from one side of the chamber toward the other side of the chamber along a first rotation direction, and which has a current flowing in the first rotation direction; an extension antenna which is connected to one end of the helical antenna positioned at said one side of the chamber, and which has a current flowing in the direction opposite to the first rotation direction; and a connection antenna for interconnecting the extension antenna and the helical antenna.

2 Claims, 4 Drawing Sheets

(58) Field of Classification Search
USPC ......... 118/723 I, 723 IR; 156/345.48, 345.49
See application file for complete search history.

(56) References Cited

FOREIGN PATENT DOCUMENTS

| | | |
|---|---|---|
| KR | 10-0516595 | 9/2005 |
| KR | 10-0572176 | 4/2006 |

OTHER PUBLICATIONS

English language abstract of JP 09-245993.
English language abstract of KR 10-0516595.
English language abstract of KR 10-0238627.
English language abstract of KR 10-0572176.

* cited by examiner

PLASMA TREATMENT APPARATUS AND PLASMA ANTENNA

TECHNICAL FIELD

The present invention disclosed herein relates to a plasma treatment apparatus and a plasma antenna, and more particularly, to a plasma treatment apparatus including an extension antenna and a plasma antenna.

BACKGROUND ART

A semiconductor device includes a plurality of layers on a silicon substrate. Such a layer is deposited on the substrate through a deposition process. The deposition process has several important issues that are important to evaluate the deposited layers and select a deposition method.

First, an example of the issues is 'quality' of the deposited layer. The 'quality' represents composition, contamination levels, defect density, and mechanical and electrical properties. The composition of each of the layers may be changed according to conditions of the deposition process. This is very important for obtaining a specific composition.

Second, another example of the issues is a uniform thickness over the wafer. Specifically, a thickness of a film deposited on a pattern having a non-planar shape with a stepped portion is very important. Here, whether the thickness of the deposited film is uniform may be determined through a step coverage which is defined as a ratio of a minimum thickness of the film deposited on the stepped portion divided by a thickness of the film deposited on the pattern.

Another issue respect to the deposition is a filling space. This represents a gap filling in which an insulating layer including an oxide layer is filled between metal lines. A gap is provided to physically and electrically isolate the metal lines from each other.

Among the issues, uniformity is one of very important issues with respect to the deposition process. A non-uniform layer may cause high electrical resistance on the metal lines to increase possibility of mechanical damage.

DISCLOSURE

Technical Problem

The present invention provides a plasma treatment apparatus and plasma antenna which secure process uniformity.

The objects of the present invention will become apparent with reference to the drawings.

Technical Solution

Embodiments of the inventive concept provide plasma treatment apparatuses including: a chamber configured to provide an inner space in which a process for an object to be treated is performed; and an antenna disposed to surround a side part of the chamber, the antenna forming electric fields in the inner space to generate plasma from the source gas supplied into the inner space, wherein the antenna includes: a helical antenna disposed in a helical shape from one side of the chamber toward the other side of the chamber along a first rotation direction, the helical antenna having a current flowing in the first rotation direction; an extension antenna connected to one end of the helical antenna disposed at a side of the chamber, the extension antenna having a current flowing in a direction opposite to the first rotation direction; and a connection antenna connecting the extension antenna to the helical antenna.

In some embodiments, the extension antenna may have the substantially same height as the one end of the helical antenna.

In other embodiments of the inventive concept, plasma treatment apparatuses include: a chamber configured to provide an inner space in which a process for an object to be treated is performed; and an antenna disposed to surround a side part of the chamber, the antenna forming electric fields in the inner space to generate plasma from the source gas supplied into the inner space, wherein the antenna includes: a helical antenna disposed in a helical shape from one side of the chamber toward the other side of the chamber; an extension antenna spaced substantially parallel to one end of the helical antenna disposed on one side of the chamber, the extension antenna having the substantially same height as that of the one end of the helical antenna; and a connection antenna connecting the extension antenna to the helical antenna.

In some embodiments, the helical antenna may have a current flowing in a direction opposite to that of a current flowing into the extension antenna.

In still other embodiments of the inventive concept, plasma antennas forming an electric field to generate plasma from a source gas include: a helical antenna disposed in a helical shape from one side of the chamber toward the other side of the chamber along a first rotation direction, the helical antenna having a current flowing in the first rotation direction; an extension antenna connected to one end of the helical antenna disposed at a side of the chamber, the extension antenna having a current flowing in a direction opposite to the first rotation direction; and a connection antenna connecting the extension antenna to the helical antenna.

In some embodiments, the extension antenna may have the substantially same height as the one end of the helical antenna.

In even other embodiments of the inventive concept, plasma antennas forming an electric field to generate plasma from a source gas include: a helical antenna disposed in a helical shape from one side of the chamber toward the other side; an extension antenna spaced substantially parallel to one end of the helical antenna disposed on the one side, the extension antenna having the substantially same height as that of the one end; and a connection antenna connecting the extension antenna to the helical antenna.

In some embodiments, the helical antenna may have a current flowing in a direction opposite to that of a current flowing into the extension antenna.

Advantageous Effects

According to the present invention, the plasma having uniform density may be generated within the chamber.

Also, the process uniformity with respect to the object to be treated may be secured using the plasma.

BEST MODE

Figure 1:
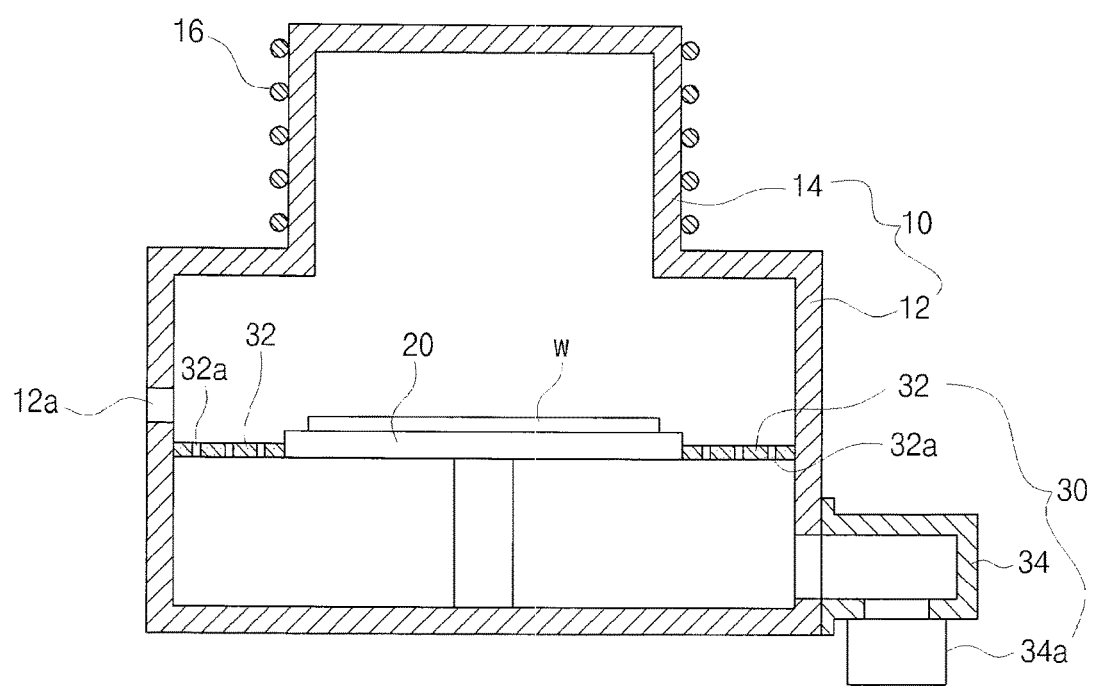
FIG. 1 is a schematic view of a plasma treatment apparatus according to the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the dimensions of elements are exaggerated for clarity of illustration, like reference numerals refer to like elements.

Although an inductively coupled plasma (ICP) process is described below as an example, the present invention may be applied to various plasma processes. Also, although a substrate is described below as an example, the present invention may be applied to various objects to be treated.

FIG. 1 is a schematic view of a plasma treatment apparatus according to the present invention. A plasma treatment apparatus includes a chamber 10 having an inner space in which processes for processing a substrate W are performed. The chamber 10 includes a process chamber 12 and a generating chamber 14. Here, the processes for processing the substrate W are performed within the process chamber 12, and plasma is generated from a source gas supplied from the outside within the generating chamber 14.

A support plate 20 is disposed within the process chamber 12. The substrate W is placed on the support plate 20. The substrate W is loaded into the process chamber 12 through an inlet 12a defined in a side of the process chamber 12, and the loaded substrate W is placed on the plate 20. Also, the support plate may be an electrostatic chuck (E-chuck). A separate helium (He) back surface cooling system (not shown) may be provided to precisely control a temperature of a wafer placed on the support plate 20.

A plasma antenna 16 is disposed on around the generating chamber 14. The plasma antenna 16 is connected to a radio frequency (RF) generator through an input line (not shown). A matcher (not shown) is disposed between the plasma antenna 16 and the RF generator.

When a high-frequency current is supplied through the RF generator, the supplied high-frequency current is supplied into the plasma antenna 16. The plasma antenna 16 converts the high-frequency current into a magnetic field to generate plasma from the source gas supplied into the chamber 10.

An exhaust line 34 is connected to a side of the process chamber 12. A pump 34a is connected to the exhaust line 34. The plasma and byproducts generated within the chamber 10 are discharged through the exhaust line 34 to the outside of the chamber 10. Here, the pump 34a forcibly discharges the plasma and byproducts.

The plasma and byproducts within the chamber 10 are introduced into the exhaust line 34 through an exhaust plate 32. The exhaust plate 32 is disposed substantially parallel to the support plate 20 outside the support plate 20. The plasma and byproducts within the chamber 10 are introduced into the exhaust line 34 through exhaust holes 32a.

Figure 2:
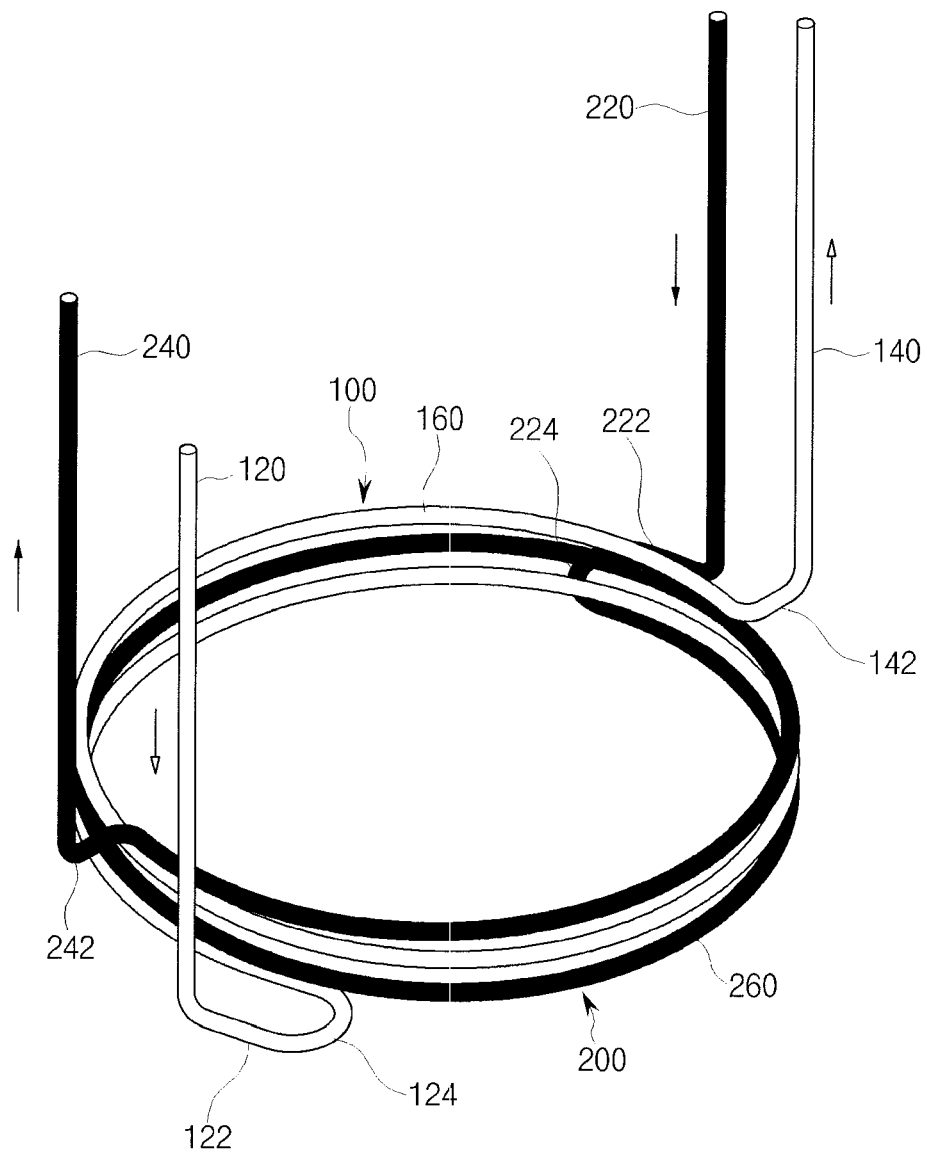
FIG. 2 is a perspective view illustrating a plasma antenna of FIG. 1.
Figure 3:
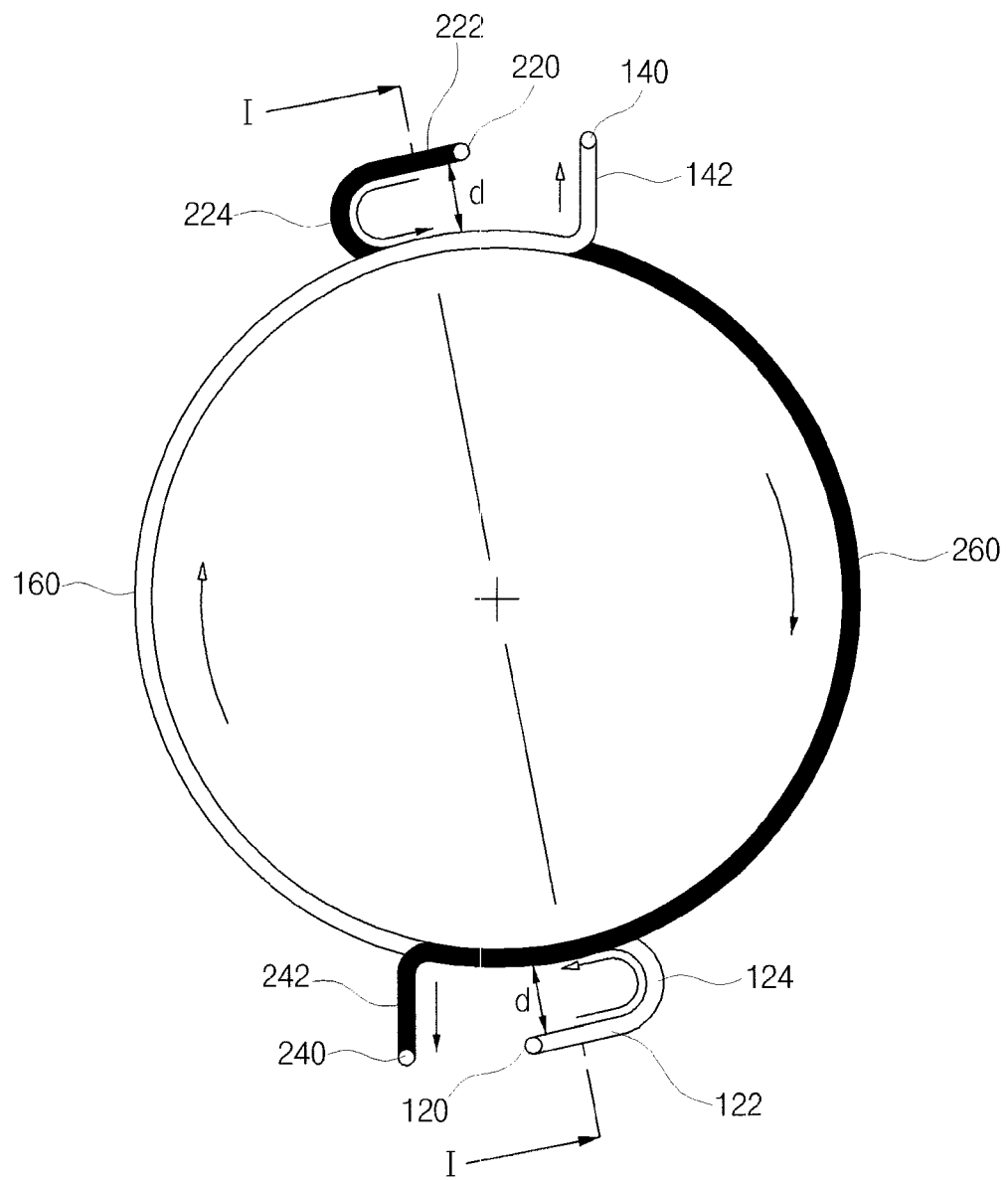
FIG. 3 is a plan view illustrating the plasma antenna of FIG. 2.
Figure 4:
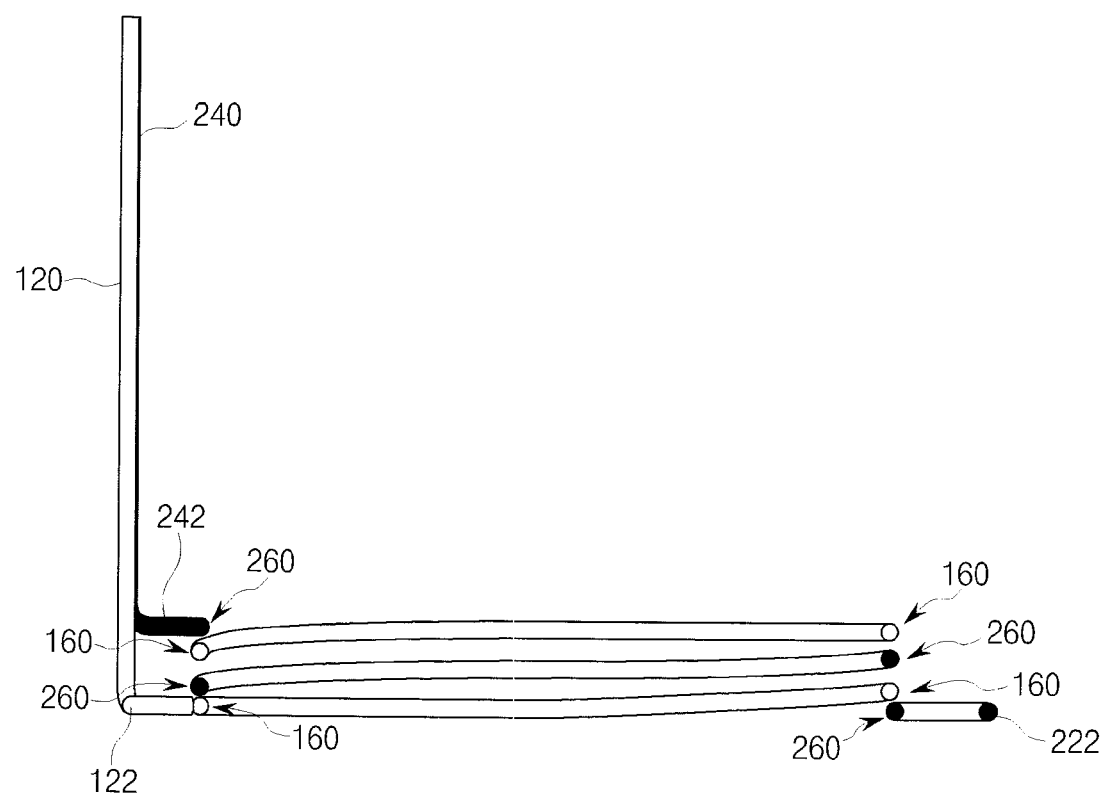
FIG. 4 is a sectional view taken along line I-I of FIG. 3.

FIG. 2 is a perspective view illustrating the plasma antenna 16 of FIG. 1. FIG. 3 is a plan view illustrating the plasma antenna 16 of FIG. 2. FIG. 4 is a sectional view taken along line I-I of FIG. 3.

The plasma antenna 16 includes a first antenna 100 and a second antenna 200. The first and second antennas 100 and 200 have the substantially same configuration and function as each other.

As shown in FIG. 2, the first antenna 100 includes a first input antenna 120, a first output antenna 140, and a first helical antenna 160. The first helical antenna 160 has a helical shape arising from a lower portion of the generating chamber 14 toward an upper portion in a clockwise direction to surround an outer circumference of the generating chamber 14. The first input antenna 120 is connected to a lower end of the first helical antenna 160, and the first output antenna 140 is connected to an upper end of the first helical antenna 160.

As shown in FIG. 2, the first antenna 120 further includes a first extension antenna 122 and a first lower connection antenna 124. The first input antenna 120 is connected to the lower end of the helical antenna 160 through the first extension antenna 122 and the first lower connection antenna 124. The first extension antenna 122 is disposed spaced from and substantially parallel to the lower end of the first helical antenna 160 and has the substantially same height as the lower end of the first helical antenna 160. The first extension antenna 122 has a shorter length than that of the first helical antenna 160. The first lower connection antenna 124 connects the first extension antenna 122 to the first helical antenna 160.

As shown in FIG. 2, the first antenna 100 further includes a first upper connection antenna 142. The first output antenna 140 is connected to the upper end of the first helical antenna 160 through the first upper connection antenna 142.

As shown in FIG. 2, the second antenna 200 includes a second antenna 220, a second output antenna 240, and a second helical antenna 260. The second helical antenna 260 has a helical shape arising from a lower portion of the generating chamber 14 toward an upper portion in a clockwise direction to surround an outer circumference of the generating chamber 14. The second helical antenna 260 is disposed substantially parallel to the first helical antenna 160. Also, the first helical antenna 160 and the second helical antenna 260 are alternately disposed with respect to each other.

The second input antenna 220 is connected to a lower end of the second helical antenna 260, and the second output antenna 240 is connected to an upper end of the second helical antenna 260. The second input antenna 220 is disposed at a side opposite to that of the first input antenna 120 with respect to centers of the first and second helical antennas 160 and 260 and is disposed adjacent to the first output antenna 140. Similarly, the second output antenna 240 is disposed at a side opposite to that of the first output antenna 140 with respect to centers of the first and second helical antennas 160 and 260.

As shown in FIG. 2, the second antenna 200 further include a second extension antenna 222 and a second lower connection antenna 224. The second input antenna 220 is connected to a lower end of the second helical antenna 260 through the second extension antenna 222 and the second lower connection antenna 224. The second extension antenna 222 is disposed spaced from and substantially parallel to the lower end of the second helical antenna 260 and has the substantially same height as the lower end of the second helical antenna 260. Also, the second extension antenna 222 is disposed at a side opposite to that of the first extension antenna 122 with respect to centers of the first and second helical antennas 160 and 260. The lower connection antenna connects the second extension antenna 222 to the second helical antenna 260.

As shown in FIG. 2, the second antenna 200 further includes a second upper connection antenna 242. The second output antenna 240 is connected to the upper end of the second helical antenna 260 through the second upper connection antenna 242.

Hereinafter, the plasma antenna 16 shown in FIGS. 2 to 4 will be described. The above-described first and second input antennas 120 and 220 are connected to the RF generator. When a high-frequency current is supplied through the RF generator, the supplied high-frequency current is supplied into the first and second helical antennas 160 and 260. As shown in FIG. 3, the high-frequency current flowing into the first and second helical antennas 160 and 260 flows in a clockwise direction. The first and second helical antennas 160 and 260 convert the high-frequency current into a magnetic field to generate plasma within the chamber 10.

The high-frequency current supplied into the first and second helical antennas 160 and 260 is supplied into the first and second extension antennas 122 and 222 through the first and second lower connection antennas 124 and 224. Here, the first and second extension antennas 122 and 222 convert the high-frequency current into a magnetic field. Thus, the magnetic field generated at between a lower end of the first helical antenna 160 and the first extension antenna 122 is reinforced, and the magnetic field generated at between a lower end of the second helical antenna 260 and the second extension antenna 222 is reinforced. That is, the magnetic fields generated at the lower ends of the first and second helical antennas 160 and 260 are weaker than that generated in a region defined between both ends of the first and second helical antennas 160 and 260. As a result, the magnetic field is nonuniform along a circumference direction of the substrate. The magnetic fields generated by the first and second extension antennas 122 and 222 respectively supplement the magnetic fields generated at the lower ends of the first and second helical antennas 160 and 260 to secure process uniformity.

As shown in FIG. 3, the high-frequency current flowing into the first and second extension antennas 122 and 222 flows in a count-clockwise direction, and then the high-frequency current is changed in a clockwise direction by passing through the first and second lower connection antennas 123 and 224.

As described above, it may prevent the process nonuniformity from occurring by the lower ends of the first and second helical antennas 160 and 260 to secure the process uniformity with respect to the object to be processed using the plasma.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A plasma treatment apparatus comprising:
   a chamber including
      a process chamber in which a substrate is processed, and
      a generating chamber disposed on a top of the process chamber, in which a plasma is generated from a source gas supplied into an inner space of the generating chamber; and
   an antenna disposed outside the generating chamber and forming electric fields for generating the plasma, the antenna including
      a helical antenna having a helical shape and winding an outer circumference of the generating chamber more than one turn from a lower side of the generating chamber toward an upper side of the generating chamber along a first rotation direction, the more than one turn of helical antenna having the same radius of curvature through the lower side and the upper side, the helical antenna having a first end disposed in the lower side of the generating chamber and a second end disposed in the upper side of the generating chamber and having a current flowing in the first rotation direction,
      a first connection antenna connected to the first end of the helical antenna and extending outwardly from the first end of the helical antenna,
      a second connection antenna connected to the second end of the helical antenna and extending outwardly from the second end of the helical antenna,
      an extension antenna extending from the first connection antenna and disposed farther away from the inner space of the generating chamber than the helical antenna and in a height corresponding to the lower side end of the helical antenna, the extension antenna having a shorter length than that of the helical antenna and being formed such that the current flows in a second direction opposite to the first rotation direction,
      an input antenna extending from the extension antenna for supplying the current and disposed farther away from the inner space of the generating chamber than the helical antenna, wherein the input antenna is connected to the first end of the helical antenna through the first connection antenna and the extension antenna, and
      an output antenna connected to the second connection antenna and disposed farther away from the inner space of the generating chamber than the helical antenna,
   wherein the extension antenna is formed in a circular arc shape and has a radius of curvature greater than that of the helical antenna.

2. A plasma antenna forming an electric field to generate plasma from a source gas, the plasma antenna comprising:
   a helical antenna having in a helical shape and winding an outer circumference of a generating chamber more than one turn from a lower side of the generating chamber toward an upper side of the generating chamber along a first rotation direction, the more than one turn of helical antenna having the same radius of curvature through the lower side and the upper side, the helical antenna having a first end disposed in the lower side of the generating chamber and a second end disposed in the upper side of the generating chamber and having a current flowing in the first rotation direction;
   a first connection antenna connected to the first end of the helical antenna and extending outwardly from the first end of the helical antenna;
   a second connection antenna connected to the second end of the helical antenna and extending outwardly from the second end of the helical antenna;
   an extension antenna extending from the first connection antenna and disposed farther away from the inner space of the generating chamber than the helical antenna and in a height corresponding to the lower side end of the helical antenna, the extension antenna having a shorter length than that of the helical antenna and being formed such that the current flows in a second direction opposite to the first rotation direction;

an input antenna extending from the extension antenna for supplying the current and disposed farther away from the inner space of the generating chamber than the helical antenna, wherein the input antenna is connected to the first end of the helical antenna through the first connection antenna and the extension antenna; and an output antenna connected to the second connection antenna and disposed farther away from the inner space of the generating chamber than the helical antenna, wherein the extension antenna is formed in a circular arc shape and has a radius of curvature greater than that of the helical antenna.

* * * * *